(12) United States Patent
Ji et al.

(10) Patent No.: US 9,939,596 B2
(45) Date of Patent: Apr. 10, 2018

(54) OPTICAL INTEGRATED CIRCUIT PACKAGE

(71) Applicant: Samsung Electronics Co., Ltd., Suwon-si, Gyeonggi-do (KR)

(72) Inventors: Ho-chul Ji, Seongnam-si (KR); Keun-yeong Cho, Suwon-si (KR); In-sung Joe, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/257,038

(22) Filed: Sep. 6, 2016

(65) Prior Publication Data
US 2017/0123173 A1    May 4, 2017

(30) Foreign Application Priority Data

Oct. 29, 2015    (KR) .................. 10-2015-0151373
Mar. 28, 2016    (KR) .................. 10-2016-0036966

(51) Int. Cl.
*G02B 6/42*      (2006.01)
*G02B 6/12*      (2006.01)

(52) U.S. Cl.
CPC ....... *G02B 6/4251* (2013.01); *G02B 6/12004* (2013.01); *G02B 6/4214* (2013.01); *G02B 6/4269* (2013.01); *G02B 6/4281* (2013.01); *G02B 6/4292* (2013.01); *H01L 2224/16225* (2013.01)

(58) Field of Classification Search
CPC ........... G02B 6/42; G02B 6/12; G02B 6/4251
USPC .......................................................... 385/14
See application file for complete search history.

(56) References Cited

U.S. PATENT DOCUMENTS

| | | | | |
|---|---|---|---|---|
| 5,369,529 A * | 11/1994 | Kuo | ..................... | G02B 6/4214 250/551 |
| 5,515,468 A * | 5/1996 | DeAndrea | ............ | G02B 6/4201 385/88 |
| 5,721,426 A * | 2/1998 | Sakai | ................... | G02B 6/4246 250/227.11 |
| 5,896,271 A * | 4/1999 | Jensen | ................ | H01L 23/3677 165/80.3 |
| 6,954,592 B2 * | 10/2005 | Tan | ...................... | G02B 6/4206 398/135 |
| 7,322,754 B2 * | 1/2008 | Wolf | ..................... | G02B 6/4214 385/88 |
| 7,394,665 B2 | 7/2008 | Hamasaki et al. | | |
| 7,497,596 B2 * | 3/2009 | Ge | ............................ | F21V 3/00 362/294 |
| 8,902,356 B2 * | 12/2014 | Seo | .................... | H01L 27/14618 348/374 |

(Continued)

FOREIGN PATENT DOCUMENTS

KR      10-0720789 B1     5/2007

*Primary Examiner* — Kaveh C Kianni
(74) *Attorney, Agent, or Firm* — Myers Bigel, P.A.

(57) ABSTRACT

An optical integrated circuit (IC) package includes an optical IC including an optical IC substrate, an optical IC including an optical IC substrate, an electrical integrated circuit device (EICD) on the optical IC substrate, at least one optical device spaced apart from the EICD on the optical IC substrate, an optical interface on a first side of the optical IC substrate, an electrical interface located on a second side of the optical IC substrate, and an encapsulation member configured to encapsulate the optical IC, the EICD, the at least one optical device, the optical interface, and the electrical interface.

16 Claims, 21 Drawing Sheets

(56) References Cited

U.S. PATENT DOCUMENTS

| | | | |
|---|---|---|---|
| 8,971,676 B1 | 3/2015 | Thacker et al. | |
| 9,709,760 B2* | 7/2017 | Stapleton | H04B 10/40 |
| 2003/0155661 A1* | 8/2003 | Auburger | H01L 23/3677 |
| | | | 257/778 |
| 2003/0201462 A1* | 10/2003 | Pommer | G02B 6/4201 |
| | | | 257/200 |
| 2005/0001896 A1* | 1/2005 | Wakisaka | G02B 3/0031 |
| | | | 347/241 |
| 2006/0017069 A1* | 1/2006 | Bergmann | C09J 5/06 |
| | | | 257/212 |
| 2006/0039658 A1* | 2/2006 | Furuyama | G02B 6/25 |
| | | | 385/90 |
| 2006/0192221 A1* | 8/2006 | Zhou | H01S 5/02296 |
| | | | 257/98 |
| 2007/0147747 A1 | 6/2007 | Inujima et al. | |
| 2008/0278061 A1* | 11/2008 | De Samber | H01L 25/167 |
| | | | 313/498 |
| 2008/0285303 A1* | 11/2008 | Matsui | G02B 6/4201 |
| | | | 362/580 |
| 2009/0321749 A1* | 12/2009 | Peiler | H01L 33/64 |
| | | | 257/79 |
| 2010/0096993 A1* | 4/2010 | Ashdown | F21V 29/004 |
| | | | 315/113 |
| 2011/0186873 A1* | 8/2011 | Emerson | H01L 33/48 |
| | | | 257/88 |
| 2012/0063718 A1* | 3/2012 | Steijer | G02B 6/4201 |
| | | | 385/14 |
| 2012/0075216 A1* | 3/2012 | Black | G02B 26/001 |
| | | | 345/173 |
| 2012/0116632 A1* | 5/2012 | Bechtel | B60Q 1/1423 |
| | | | 701/36 |
| 2013/0002167 A1* | 1/2013 | Van de Ven | H05B 33/0815 |
| | | | 315/297 |
| 2013/0122672 A1* | 5/2013 | Or-Bach | H01L 21/8221 |
| | | | 438/199 |
| 2013/0270592 A1* | 10/2013 | Reiherzer | H01L 33/52 |
| | | | 257/98 |
| 2013/0308898 A1* | 11/2013 | Doerr | G02B 6/428 |
| | | | 385/14 |
| 2014/0012138 A1* | 1/2014 | Talbert | A61B 5/0077 |
| | | | 600/476 |
| 2014/0021493 A1* | 1/2014 | Andrews | H01L 33/60 |
| | | | 257/88 |
| 2014/0064659 A1 | 3/2014 | Doerr et al. | |
| 2014/0203175 A1 | 7/2014 | Kobrinsky et al. | |
| 2014/0321803 A1 | 10/2014 | Thacker et al. | |
| 2014/0327902 A1* | 11/2014 | Giger | G01S 17/08 |
| | | | 356/5.01 |
| 2014/0369693 A1 | 12/2014 | Peterson et al. | |
| 2014/0376000 A1 | 12/2014 | Swanson et al. | |
| 2015/0003841 A1 | 1/2015 | McLaren et al. | |
| 2015/0022999 A1* | 1/2015 | Yu | F21K 9/90 |
| | | | 362/84 |
| 2016/0003419 A1* | 1/2016 | Chen | H01L 25/0753 |
| | | | 362/294 |

\* cited by examiner

OPTICAL INTEGRATED CIRCUIT PACKAGE

CROSS-REFERENCE TO RELATED APPLICATIONS

This application claims the benefit of Korean Patent Application No. 10-2015-0151373, filed on Oct. 29, 2015, and Korean Patent Application No. 10-2016-0036966, filed on Mar. 28, 2016, in the Korean Intellectual Property Office, the disclosures of which are incorporated herein in their entireties by reference.

BACKGROUND

The inventive concept relates to an optical integrated circuit (IC) package, and more particularly, to an optical IC package embodied on an optical IC substrate.

The demands for the downscaling and higher speed of electronic devices have led to a need for high-speed transmission of signals. Because electrical signals are transmitted through interconnection lines, such as copper lines, there is a limit to accelerating transmission of the electric signals. As a result, a signal transmission method using optical signals has been used.

SUMMARY

The inventive concept provides an optical integrated circuit (IC) package, which may meet the needs for the downscaling and acceleration of electronic devices.

According to an aspect of the inventive concept, there is provided an optical IC package comprising an optical IC comprising an optical IC substrate, an electrical integrated circuit device (EICD) on the optical IC substrate, at least one optical device located on the optical IC substrate and spaced apart from the EICD, an optical interface on a first side of the optical IC substrate, an electrical interface on a second side of the optical IC substrate, and an encapsulation member that encapsulates the optical IC, the EICD, the at least one optical device, the optical interface, and the electrical interface.

According to another aspect of the inventive concept, there is provided an optical IC package comprising an optical IC comprising an optical IC substrate, an EICD on the optical IC substrate and electrically connected to an interconnection line of the optical IC substrate, at least one optical device configured to process an optical signal and an electrical signal in the optical IC, an optical interface on a first side of the optical IC substrate and optically connected to the optical IC and the at least one optical device, an electrical interface on a second side of the optical IC substrate and electrically connected to the EICD and the at least one optical device, and an encapsulation member that encapsulates the optical IC, the EICD, the at least one optical device, the optical interface, and the electrical interface.

According to another aspect of the inventive concept, there is provided an optical IC package comprising an optical IC comprising an optical IC substrate, an EICD on the optical IC substrate and electrically connected to an interconnection line of the optical IC substrate, a first optical device integrated with the optical IC substrate and configured to generate an optical signal, a second optical device on the optical IC substrate and configured to process the optical signal and an electrical signal, an optical interface on a first side of the optical IC substrate and optically connected to the optical IC, the first optical device, and the second optical device, an electrical interface located on a second side of the optical IC substrate and electrically connected to the EICD, the first optical device, and the second optical device, and an encapsulation member encapsulating the optical IC, the EICD, the first optical device, the second optical device, the optical interface, and the electrical interface.

According to still another aspect of the inventive concept, an apparatus comprises an optical interface, an electrical interface, an optical integrated circuit substrate that couples the optical interface to the electrical interface, an optical device on the optical integrated circuit substrate, and an encapsulation member that encapsulates the optical interface, the electrical interface, the optical integrated circuit substrate, and the optical device.

It is noted that aspects of the inventive concept described with respect to one embodiment, may be incorporated in a different embodiment although not specifically described relative thereto. That is, all embodiments and/or features of any embodiment can be combined in any way and/or combination. These and other aspects of the inventive concept are explained in detail in the specification set forth below.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

The inventive concept is described more fully hereinafter with reference to the accompanying drawings, in which embodiments of the inventive concept are shown. However, specific structural and functional details disclosed herein are merely representative for purposes of describing example embodiments. Thus, the inventive concepts may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the inventive concepts.

Figure 1:
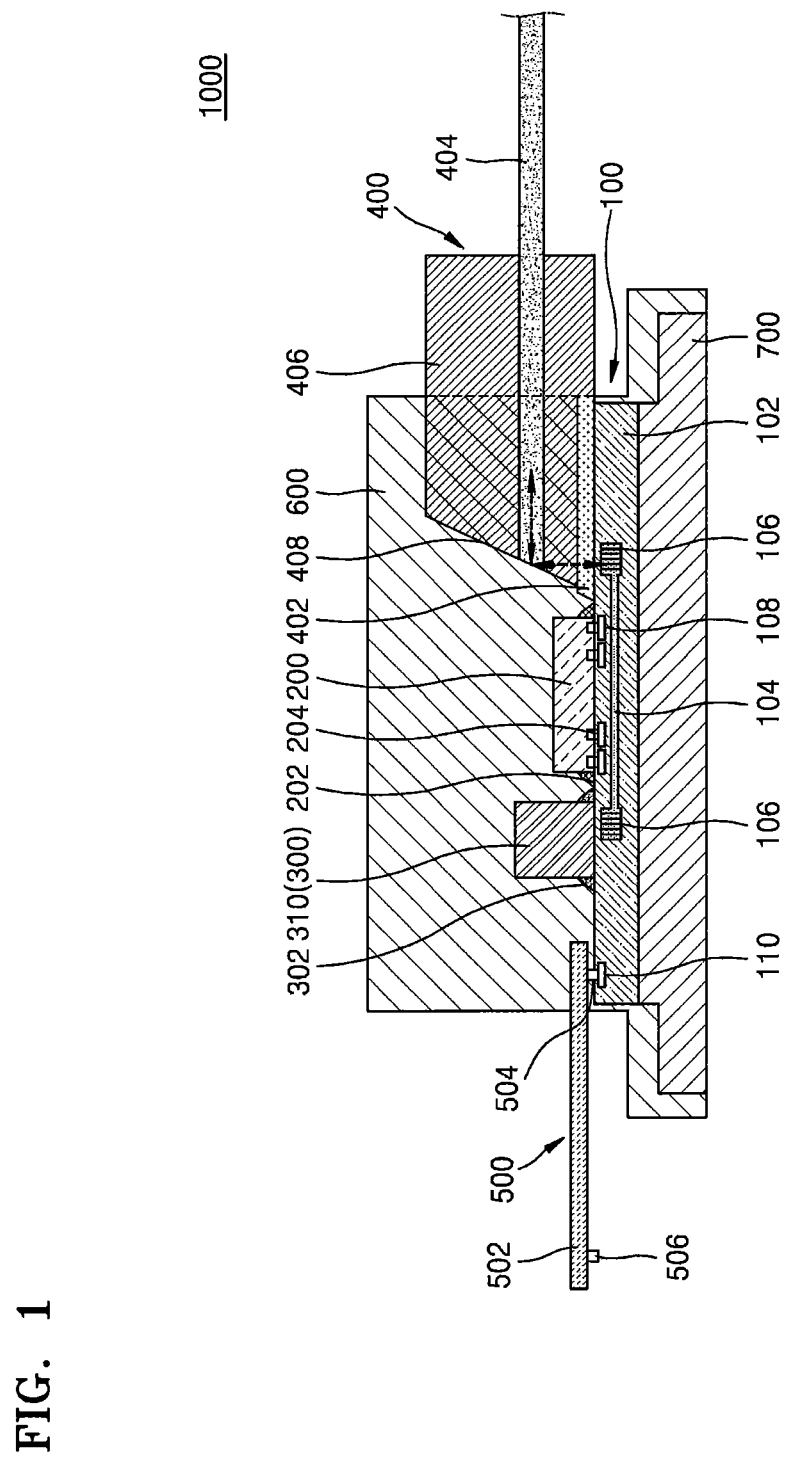
FIG. 1 is a cross-sectional view of an optical IC package according to embodiments of the inventive concept.

FIG. 1 is a cross-sectional view of an optical integrated circuit (IC) package 1000 according to embodiments of the inventive concept.

Specifically, the optical IC package 1000 may include an optical IC 100 including an optical IC substrate 102. The optical IC 100 may be referred to as an interposer. The optical IC substrate 102 may include a silicon semiconductor substrate. The optical IC substrate 102 may include a Group III-V semiconductor substrate. An optical waveguide 104 and an optical coupler 106 may be formed on the optical IC substrate 102.

Although FIG. 1 illustrates an embodiment in which the optical waveguide 104 and the optical coupler 106 are formed within the optical IC substrate 102, the optical waveguide 104 and the optical coupler 106 may be formed on a surface of the optical IC substrate 102. The optical coupler 106 may be a vertical optical coupler. The optical waveguide 104 may be a path through which light (or an optical signal) travels. The optical coupler 106 may couple light, which travels in a horizontal direction of the optical IC substrate 102, in a vertical direction.

An electrical integrated circuit device (EICD) 200 may be located on the optical IC substrate 102. The EICD 200 may be adhered to the optical IC substrate 102 by using an adhesive layer 202. A connection pad 204 of the EICD 200 may be electrically connected to a first interconnection pad 108 formed on a portion of the optical IC substrate 102.

At least one optical device (OD) 300 may be installed on the optical IC substrate 102 apart from the EICD 200. The at least one optical device 300 may be adhered to the optical IC substrate 102 by using an adhesive layer 302. The optical device 300 may include an electro-optic converter, a photoelectric converter, or an optical modulator. The optical device 300 of FIG. 1 may include an electro-optic converter 310 (e.g., an laser diode (LD) device). Light (or an optical signal) generated by the electro-optic converter 310 may be transmitted through the optical coupler 106 to the optical waveguide 104.

An optical interface 400 may be installed on one side of the optical IC substrate 102. The optical interface 400 may be adhered to the optical IC substrate 102 by using an adhesive layer 402. The optical interface 400 may be optically connected to the optical IC substrate 102. The optical interface 400 may be optically connected to the optical waveguide 104 through the optical coupler 106.

The optical interface 400 may include a single optical fiber 404. The optical fiber 404 may be protected by a protection layer 406. As described below, the optical interface 400 may be an optical fiber array including a plurality of optical fibers. The optical fiber 404 may include an inclined section unit 408 configured to modify paths of incident light and emission light as indicated by arrows.

An electrical interface 500 may be installed on another side of the optical IC substrate 102. The electrical interface 500 may be electrically connected to a second interconnection pad 110 formed on the optical IC substrate 102. The electrical interface 500 may include a flexible PCB 502. A first connection pad 504 formed on one side of the flexible PCB 502 may be electrically connected to the second interconnection pad 110.

The first interconnection pad 108 and the second interconnection pad 110 may be electrically connected to each other through a circuit interconnection line (not shown) or not electrically connected to each other. A second connection pad 506 formed on another side of the flexible PCB 502 may be connected to an external base PCB. The second connection pad 506 may be electrically connected to the second interconnection pad 110. An electrical signal received through the second connection pad 506 may be transmitted through the flexible PCB 502 to the second interconnection pad 110.

When necessary, a heat sink 700 may be installed under the optical IC substrate 102 and brought into contact with the optical IC substrate 102. The heat sink 700 may function to externally emit heat generated by the optical IC 100.

The optical IC package 1000 may include an encapsulation member 600 configured to encapsulate an optical IC 100, an EICD 200, an optical device 300, an optical interface 400, and an encapsulation member 600. In an embodiment, the inside of the encapsulation member 600 may be filled with an air layer, a nitrogen layer, or a vacuum layer. In an embodiment, the encapsulation member 600 may be filled with a transparent material layer. When the heat sink 700 is installed, the encapsulation member 600 may contact both sides of the heat sink 700 and encapsulate the heat sink 700.

As described above, the optical IC package 1000 may include the optical IC 100 including the optical IC substrate 102, the EICD 200 located on the optical IC substrate 102, and the optical interface 400 and the electrical interface 500 formed on the optical IC substrate 102.

Thus, the optical IC package 1000 may mount various optical devices on the optical IC substrate 102, which may easily be optically and electrically connected to external apparatuses. Also, the optical IC package 1000 may include the optical interface 400 and may facilitate the downscaling and acceleration of electronic devices. Also, the optical IC package 1000 may facilitate optical and electrical connection of the optical IC substrate 102 with the optical interface 400 and the electrical interface 500 and improve quality of transmission of signals.

Figure 2:
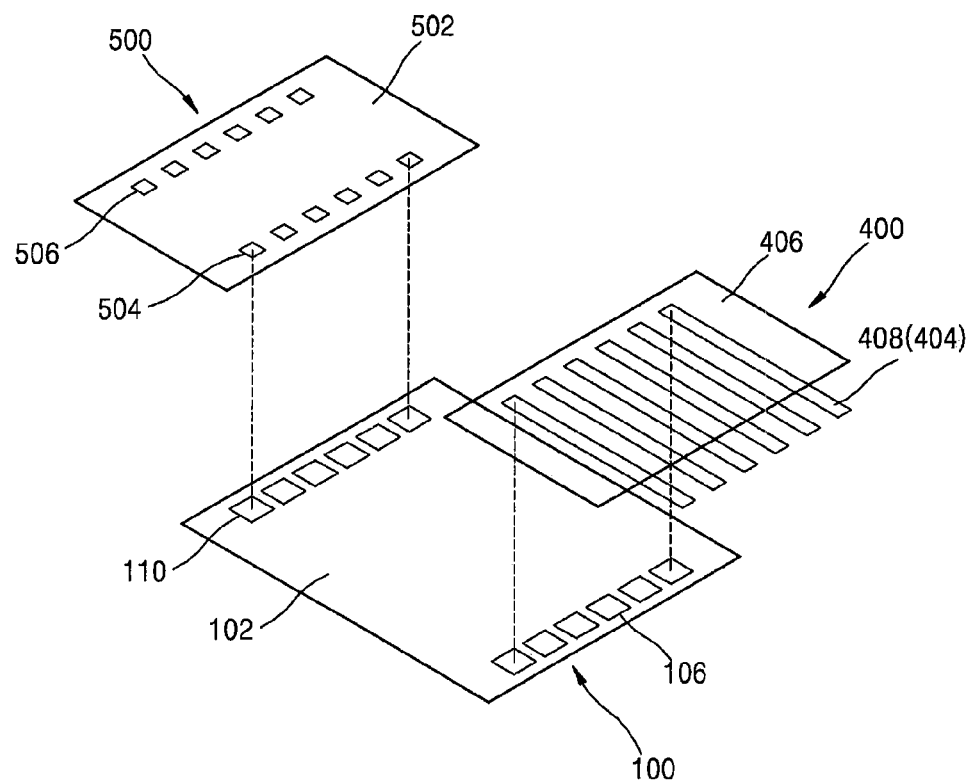
FIG. 2 is a perspective view of connection of an optical IC of the optical IC package of FIG. 1 with an optical interface and an electrical interface, according to embodiments of the inventive concept.

FIG. 2 is a perspective view of the connection of the optical IC 100 of the optical IC package 1000 of FIG. 1 with the optical interface 400 and the electrical interface 500, according to embodiments of the inventive concept.

Specifically, an optical interface 400 may be installed on one side of the optical IC substrate 102 included in the optical IC 100. A plurality of optical couplers 106 may be formed on the optical IC substrate 102. The optical interface 400 may be an optical fiber array 408 including a plurality of optical fibers 404. The optical fiber array 408 may be protected by a protection layer 406.

Thus, the optical fiber array 408 may be optically connected to the optical couplers 106. In other words, the optical fiber array 408 and the optical couplers 106 may transmit light (or an optical signal) to each other.

An electrical interface 500 may be installed on another side of the optical IC substrate 102. The electrical interface 500 may include a flexible PCB. A plurality of second interconnection pads 110 may be formed on another side of the optical IC substrate 102.

First connection pads 504 and second connection pads 506 may be respectively installed on one side and another side of a flexible PCB 502. The first connection pads 504 may be electrically connected to the second interconnection pads 110. The second connection pads 506 may be connected to an external base PCB. The base PCB may be a circuit board of an applied module (or an applied device). The first connection pads 504 and the second connection pads 506 may be electrically connected to each other through an interface interconnection line (not shown).

Thus, the electrical interface 500 may be electrically connected to the optical IC substrate 102. In other words, electrical signals received through the second connection pads 506 of the electrical interface 500 may be transmitted through the flexible PCB 502 to the second interconnection pads 110.

Figure 3:
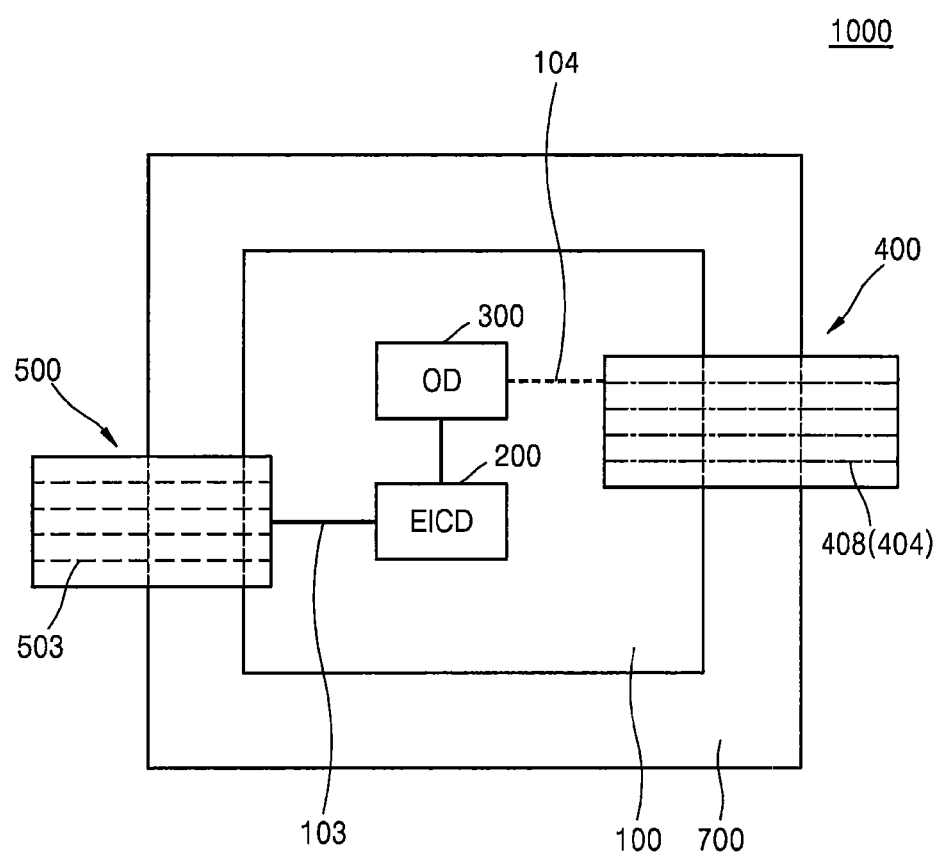
FIG. 3 is a plan view of electrical and optical connections of an optical device of the optical IC package of FIG. 1 with an electrical integrated circuit device (EICD), according to embodiments of the inventive concept.

FIG. 3 is a plan view of electrical connections and optical connections of an optical device of the optical IC package 1000 of FIG. 1 with an EICD according to embodiments of the inventive concept.

Specifically, as described above, the optical IC package 1000 may include an optical IC 100, an EICD 200, an optical device 300, an electrical interface 500, an optical interface 400, and a heat sink 700.

An electrical signal transmitted through an interface interconnection line 503 of the electrical interface 500 may be received by the EICD 200 and the optical device 300 through a circuit interconnection line 103. When the optical device 300 is an electro-optic converter (e.g., an LD device), an optical signal generated by the optical device 300 may be externally transmitted through an optical fiber array 408 or an optical fiber 404 of the optical interface 400 by using an optical waveguide 104.

Meanwhile, an optical signal that is externally received through the optical fiber array 408 or the optical fiber 404 included in the optical interface 400 may be transmitted to the optical device 300 (e.g., a photoelectric converter) through the optical waveguide 104. The photoelectric converter may be a PD device. An electrical signal converted by the optical device 300 may be externally transmitted through the EICD 200 and the interface interconnection line 503 of the electrical interface 500.

Figure 4:
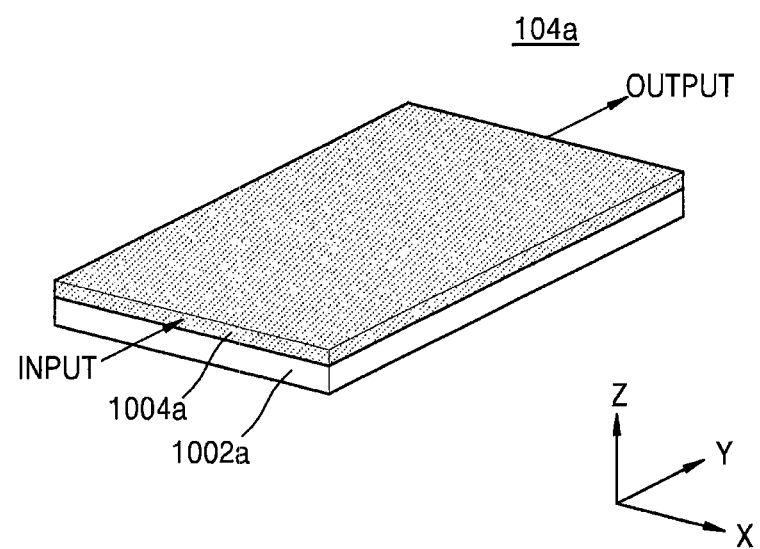
FIGS. 4 to 6 are plan views of an optical waveguide of the optical IC package of FIG. 1, according to embodiments of the inventive concept.
Figure 5:
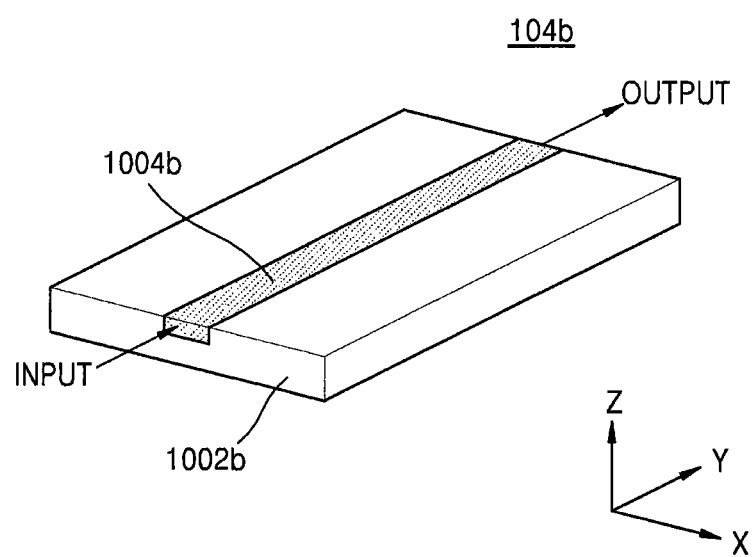
Figure 6:
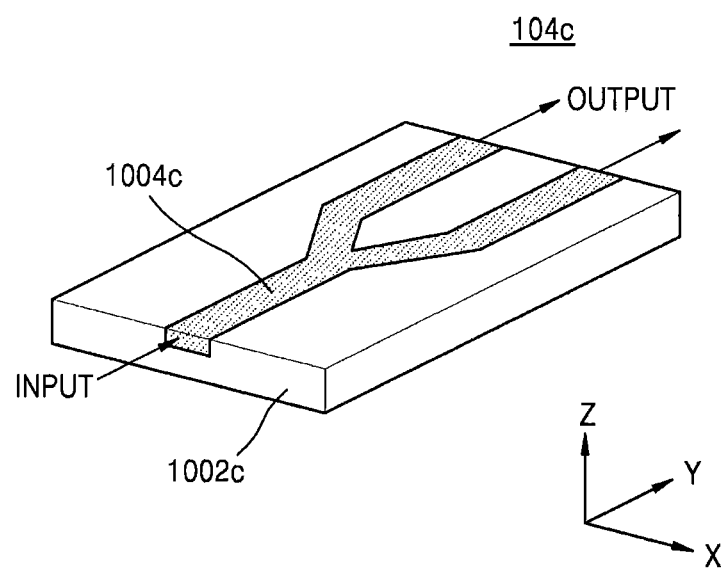

FIGS. 4 to 6 are plan views of the optical waveguide 104 of the optical IC package 1000 of FIG. 1 according to various embodiments of the inventive concept.

Referring to FIGS. 4 to 6, the optical waveguide 104 of FIG. 1 may include optical waveguides 104a, 104b, and 104c. In FIGS. 4 to 6, a Y direction may be a depthwise direction, and an X direction may be a widthwise direction.

Referring to FIG. 4, the optical waveguide 104a may include a lower cladding layer 1002a and a core layer 1004a located as a one-dimensional planar slab type on the lower cladding layer 1002a and use an air layer as an upper cladding layer, but is not limited thereto. Because a refractive index of an incident light varies only in a depthwise direction Z, an optical signal passing through the optical waveguide 104a may be refracted only in the depthwise direction Z. In FIG. 4, an optical signal input to one side of the optical waveguide 104a may be output to another side of the optical waveguide 104a.

Referring to FIG. 5, the optical waveguide 104b may include a lower cladding layer 1002b and a core layer 1004b located as a channel type on the lower cladding layer 1002b and uses an air layer as an upper cladding layer, but is not limited thereto. In this case, a refractive index may vary in a depthwise direction Z and a widthwise direction X of the channel type. In FIG. 5, an optical signal input to one side of the optical waveguide 104b may be output to another side of the optical waveguide 104b.

Referring to FIG. 6, the optical waveguide 104c may include a lower cladding layer 1002c and a core layer 1004c located as a branched channel type on the lower cladding layer 1002c and uses an air layer as an upper cladding layer, but is not limited thereto. In FIG. 6, an optical signal input to one side of the optical waveguide 104c may be output to another side of the optical waveguide 104c, and the optical waveguide 104c may branch an input optical signal into two optical signals.

Figure 7:
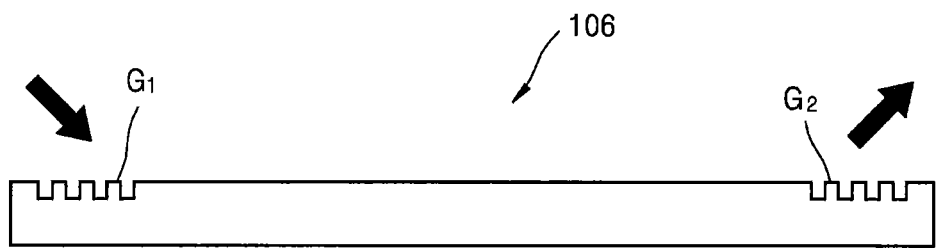
FIG. 7 is a cross-sectional view of an optical coupler of the optical IC package of FIG. 1, according to embodiments of the inventive concept.

FIG. 7 is a cross-sectional view of the optical coupler 106 of the optical IC package of FIG. 1 according to embodiments of the inventive concept.

Specifically, the optical coupler 106 may be a grating coupler. The optical coupler 106 may be embodied by forming gratings, for example, gratings G1 and G2, on ends of an optical waveguide, respectively. The optical coupler 106 may transmit and receive light by using diffraction of light incident to the gratings G1 and G2, and light may be filtered by controlling an interval between the gratings G1 and G2.

A size (i.e., a period) of a grating formed in the optical coupler 106 may be determined by a width "w" of incident light and a wave number vector (k-vector). Thus, incident light may be optically coupled with the optical coupler 106 with high optical coupling efficiency so that an appropriate grating may be formed in the optical coupler 106.

Figure 8:
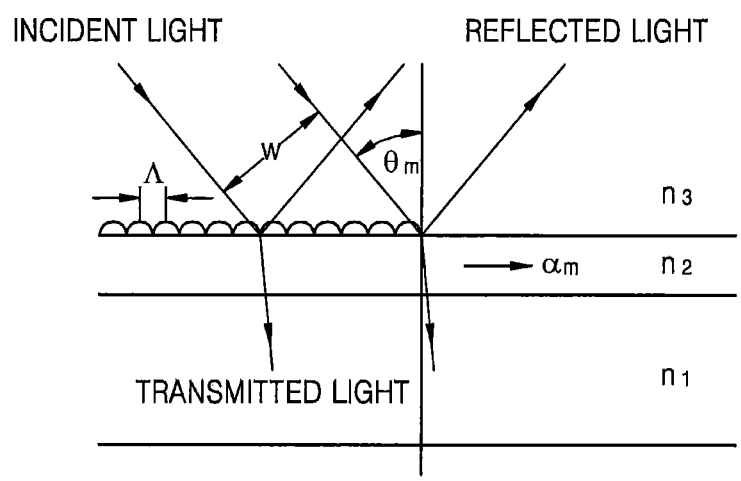
FIG. 8 is a diagram that illustrates optical coupling principles using the optical coupler of FIG. 7 according to embodiments of the inventive concept.

FIG. 8 is a diagram that illustrates optical coupling principles using the optical coupler 106 of FIG. 7.

Specifically, optical coupling conditions using the optical coupler 106 of FIG. 7 will now be described. To begin with, a phase of incident light may match a phase of light of the optical coupler 106 so that the incident light may be optically coupled with the optical coupler 106 with high optical coupling efficiency. Phase matching conditions may be expressed as shown in Equation 1:

$$\beta v = \beta 0 + v 2\pi/\Lambda \qquad (1),$$

wherein v is an integer, $\Lambda$ is a grating period, $\beta v$ is a phase of a v-th mode, and $\beta 0$ is a phase of a fundamental mode.

In addition, a guiding condition for confining incident light in a waveguide may be expressed as shown in Equation 2:

$$\alpha_m = \kappa n_3 \sin \theta_m = (2\pi/\lambda n_3) \sin \theta_m \qquad (2),$$

wherein m is an integer, $\lambda$ is a wavelength of light of an m-th mode, and $\kappa$ is a wave number and a reciprocal of a wavelength. Also, $\alpha_m$ is a condition value of a refractive index of light of the m-th mode, and $\theta_m$ is an incidence angle of m-th-mode light. In FIG. 8, w is a width of incident light, $n_1$ is a refractive index of a lower cladding layer, $n_2$ is a refractive index of a core layer, and $n_3$ is a refractive index of the outside of the waveguide or a refractive index of an upper cladding layer. A relationship of $\kappa n_3 < \alpha_m < \kappa n_2$ may be satisfied to guide incident light to the waveguide.

Figure 9:
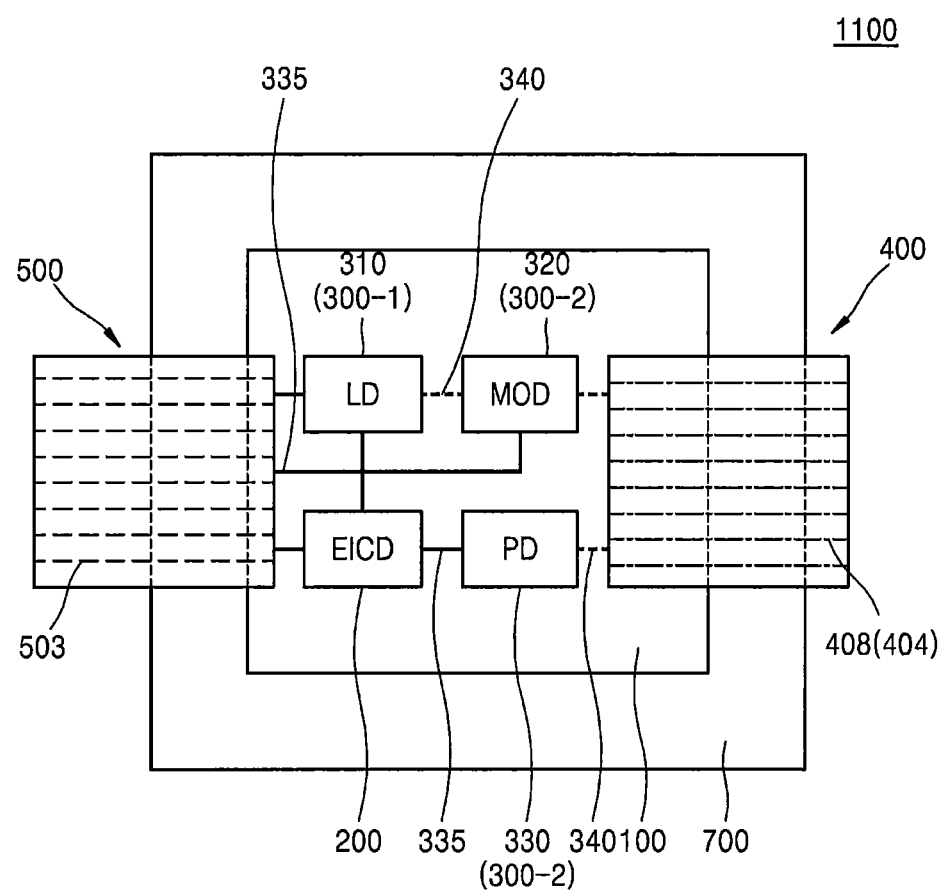
FIG. 9 is a plan view of an optical IC package according to embodiments of the inventive concept.

FIG. 9 is a plan view of an optical IC package 1100 according to embodiments of the inventive concept.

Specifically, the optical IC package 1100 of FIG. 9 may be the same as the optical IC package 1000 of FIGS. 1 to 8 except for optical devices 300-1 and 300-2. The optical IC package 1100 of FIG. 9 may be provided to illustrate electrical and optical connections of the optical devices 300-1 and 300-2 with an EICD 200. In FIG. 9, the same reference numerals are used to denote the same elements as in FIGS. 1 to 8, and repeated descriptions thereof will be simplified or omitted for brevity.

The optical IC package 1100 may include an optical IC 100, an EICD 200, the optical device 300-1 and 300-2, an electrical interface 500, an optical interface 400, and a heat sink 700. The optical device 300-1 and 300-2 may be divided into a first optical device 300-1 and a second optical device 300-2 for brevity.

The first optical device 300-1 may be an electro-optic converter LD, for example, an LD device, which may generate light (or an optical signal). The second optical device 300-2 may include an optical modulator (MOD) 320 and a photoelectric converter (PD) 330, which may process an optical signal and an electrical signal. The photoelectric converter 330 may be a photodiode (PD) device.

An electrical signal transmitted through an interface interconnection line 503 of the electrical interface 500 may be transmitted to the EICD 200, the electro-optic converter 310, and the optical modulator 320 through a circuit interconnection line 335. The electro-optic converter 310 may generate an optical signal and transmit the optical signal to the optical modulator 320.

The optical modulator 320 may modulate the optical signal in response to an electrical signal transmitted through a circuit interconnection line 335, and transmit the modulated optical signal through an optical waveguide 104 to the optical interface 400. The modulated optical signal may be externally transmitted through an optical fiber array 408 or an optical fiber 404 of the optical interface 400. When necessary, the EICD 200 may control the electro-optic converter 310 through the circuit interconnection line 335.

Meanwhile, an optical signal externally received through the optical fiber array 408 or the optical fiber 404 included in the optical interface 400 may be transmitted through the optical waveguide 340 to the photoelectric converter 330. The photoelectric converter 330 may convert an optical signal into an electrical signal and transmit the electrical signal to the electrical interface 500 through the EICD 200 and the circuit interconnection line 335. The electric signal may be externally transmitted through the interface interconnection line 503 of the electrical interface 500.

Thus, the optical IC package 1100 may be used for an optical transceiver configured to transmit or receive an optical signal. In addition, because the optical IC package 1100 includes a plurality of optical devices (e.g., the optical devices 300-1 and 300-2), optical and electrical connection of the optical IC package 1100 with external devices may be facilitated. Also, the optical IC package 1100 may include the optical interface 400 and may facilitate the downscaling and acceleration of electronic devices.

Figure 10:
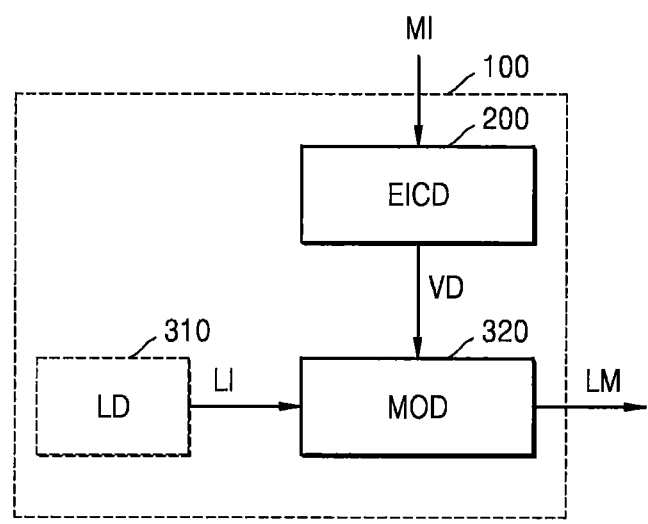
FIG. 10 is a diagram of the flow of signals of optical devices and an EICD located in the optical IC 100 of FIG. 9 according to embodiments of the inventive concept.

FIG. 10 is a diagram of the flow of signals of optical devices and the EICD 200 located in the optical IC 100 of FIG. 9 according to embodiments of the inventive concept.

Specifically, an EICD 200, an electro-optic converter (LD) 310, and an optical modulator (MOD) 320 may be installed within an optical IC 100. As described above, the EICD 200, the electro-optic converter 310, and the optical modulator 320 may be adhered to an optical IC substrate.

The EICD 200 may generate transmission electrical signals VD based on received transmission data MI. The optical modulator 320 may modulate an optical signal LI received from the electro-optic converter 310 in response to the transmitted electrical signals VD and generate a modulated optical signal LM. The modulated optical signal LM may be transmitted to an external device or a base PCB.

Figure 11:
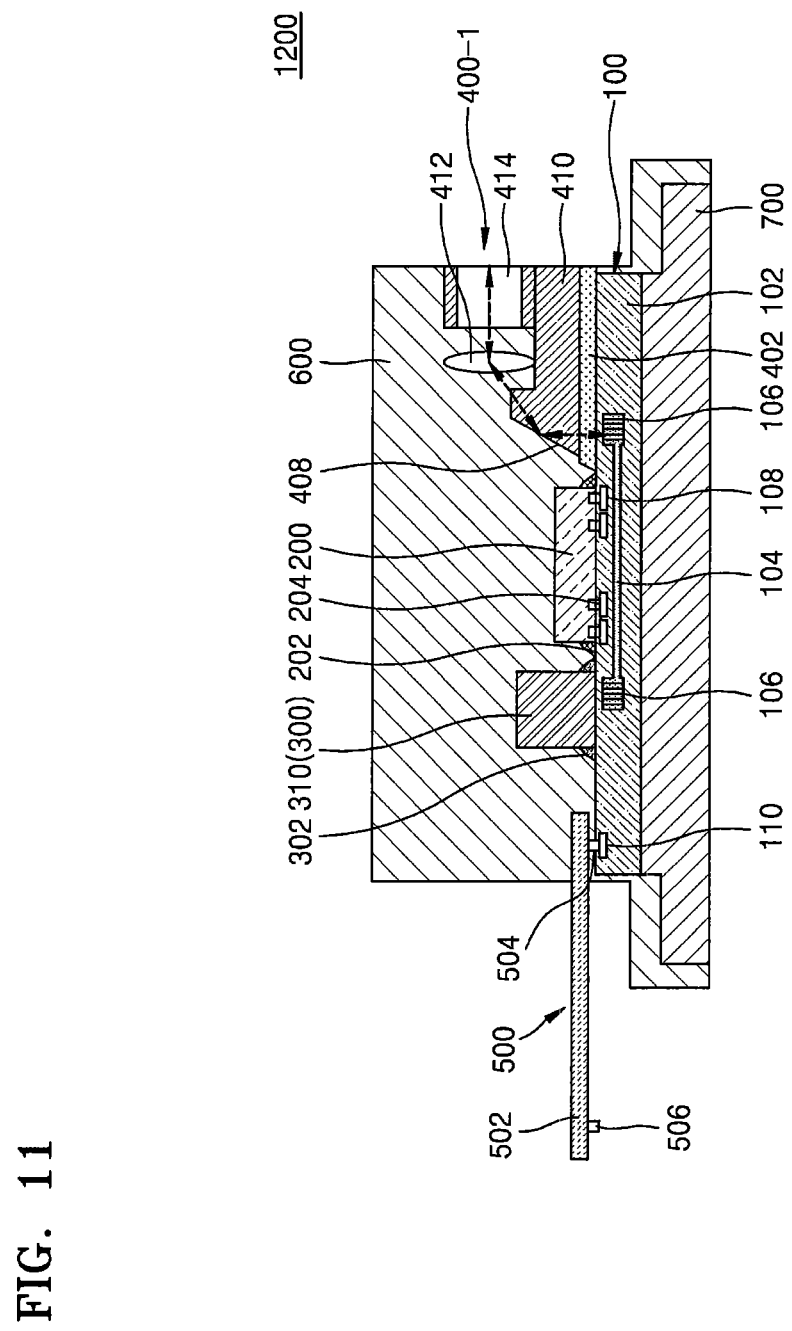
FIG. 11 is a cross-sectional view of an optical IC package according to embodiments of the inventive concept.

FIG. 11 is a cross-sectional view of an optical IC package 1200 according to embodiments of the inventive concept.

Specifically, the optical IC package 1200 may be the same as the optical IC package 1000 of FIGS. 1 to 8 except for an optical interface 400-1. In FIG. 11, the same reference numerals are used to denote the same elements as in FIGS. 1 to 8, and repeated descriptions thereof will be simplified or omitted for brevity.

The optical IC package 1200 may include an optical IC 100, an EICD 200, an optical device 300, an electrical interface 500, an optical interface 400-1, and a heat sink 700.

The optical interface 400-1 may be adhered to an optical IC substrate 102 by using an adhesive layer 402. The optical interface 400-1 may include a receptacle connector 414, a lens 412, and an alignment device 410. The lens 412 may be installed in some embodiments.

The receptacle connector 414 may be located on the alignment device 410. A plug connector (not shown) may be externally inserted so as to transmit optical signals. The alignment device 410 may align light that is input and output through the receptacle connector 414. The alignment device 410 may be a planar optical waveguide device. The alignment device 410 may include an optical waveguide having a similar refractive index to that of a core layer of an optical fiber. The alignment device 410 may include an inclined section unit 408 configured to modify paths of incident light and emission light. An optical multiplexer (MUX) and a demultiplexer (DEMUX) may be installed in the alignment device 410 as described below.

Light (or an optical signal) transmitted through the receptacle connector 414 may be transmitted to an optical coupler 106 through a lens 412 and the alignment device 410 as indicated by arrows. Thus, the optical interface 400-1 may be optically connected to an optical waveguide 104 through the optical coupler 106. The optical interface 400-1 may be optically connected to the optical IC substrate 102.

Figure 12:
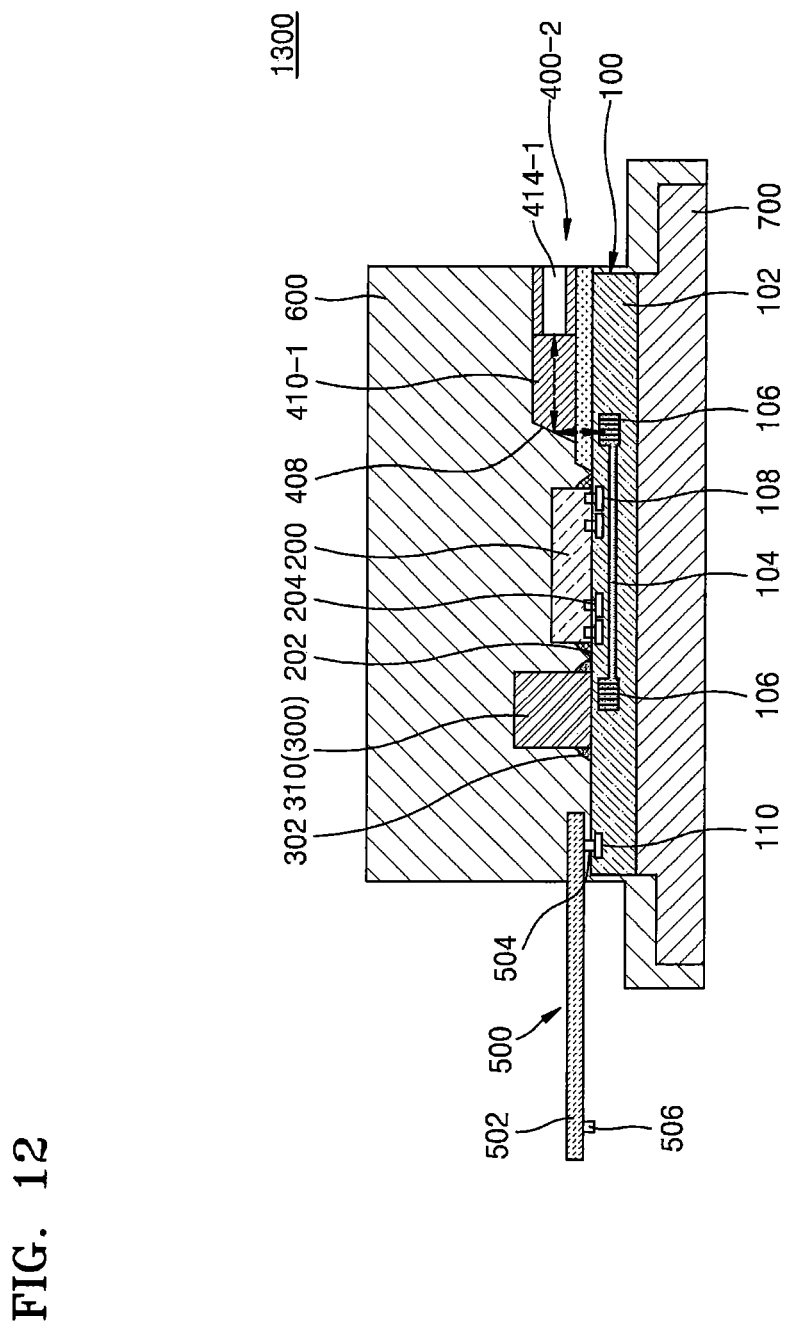
FIG. 12 is a cross-sectional view of an optical IC package according to embodiments of the inventive concept.

FIG. 12 is a cross-sectional view of an optical IC package 1300 according to embodiments of the inventive concept.

Specifically, the optical IC package 1300 may be the same as the optical IC package 1000 of FIGS. 1 to 8 except for an optical interface 400-2. In FIG. 12, the same reference numerals are used to denote the same elements as in FIGS. 1 to 8, and repeated descriptions thereof will be simplified or omitted for brevity.

The optical IC package 1300 may include an optical IC 100, an EICD 200, an optical device 300, an electrical interface 500, an optical interface 400-2, and a heat sink 700.

The optical interface 400-2 may be adhered to an IC substrate 102 by using an adhesive layer 402. The optical interface 400-1 may include a receptacle connector 414-1, a receptacle connector, and an alignment device 410-1.

The receptacle connector 414-1 may be located on one side of the alignment device 410-1. When the receptacle connector 414-1 is not located on the alignment device 410 as shown in FIG. 11, the height of the optical IC package 1300 may be reduced, and optical alignment may be facilitated.

A plug connector may be externally inserted into the receptacle connector 414-1 so as to transmit optical signals. The alignment device 410-1 may align light that is input and output through the receptacle connector 414. The alignment device 410-1 may be a planar optical waveguide device. The alignment device 410-1 may include an inclined section unit 408 configured to modify paths of incident light and emission light.

Light (or an optical signal) transmitted through the receptacle connector 414-1 may be transmitted to an optical coupler 106 through the alignment device 410-1 as indicated by arrows. Thus, the optical interface 400-2 may be optically connected to an optical waveguide 104 through the optical coupler 106. The optical interface 400-2 may be optically connected to the optical IC substrate 102.

Figure 13:
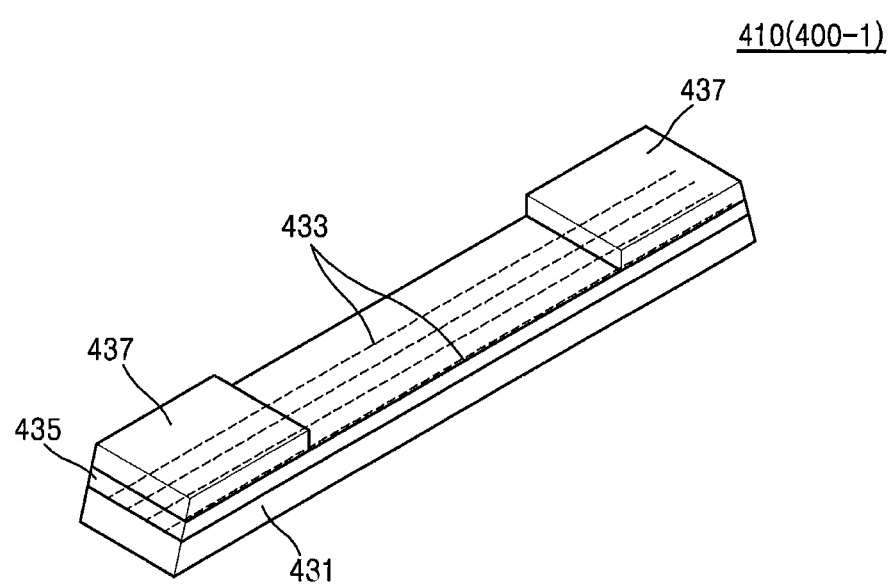
FIG. 13 is a perspective view of an example of the alignment devices of FIGS. 11 and 12 according to embodiments of the inventive concept.

FIG. 13 is a perspective view of an example of the alignment device 410 or 410-1 of FIGS. 11 and 12 according to some embodiments of the inventive concept.

Specifically, the alignment device 410 or 410-1 may include a planar optical waveguide device as described above. The alignment device 410 or 410-1 may include a lower cladding layer 431, a plurality of alignment optical waveguides 433, an upper cladding layer 435, and a lid 437. The alignment device 410 or 410-1 may include a material (e.g., silicon nitride or silicon oxide), which is transparent in the wavelength of about 1300 nm to about 1600 nm. The alignment optical waveguides 433 of the alignment device 410 or 410-1 may have a similar refractive index to that of a core layer of an optical fiber.

The alignment device 410 or 410-1 may be referred to as an alignment chip. The alignment optical waveguides 433 may be embodied on the lower cladding layer 431. The lead 437 may or may not be formed as needed.

A receptacle connector 414 may be located on the alignment device 410 as shown in FIG. 11. A receptacle connector 414-1 may be located on one side of the alignment device 410-1 as shown in FIG. 12.

As described above, an optical signal transmitted through the receptacle connector 414-1 may be transmitted to an optical waveguide formed on an optical IC substrate through the alignment optical waveguide 433.

Figure 14:
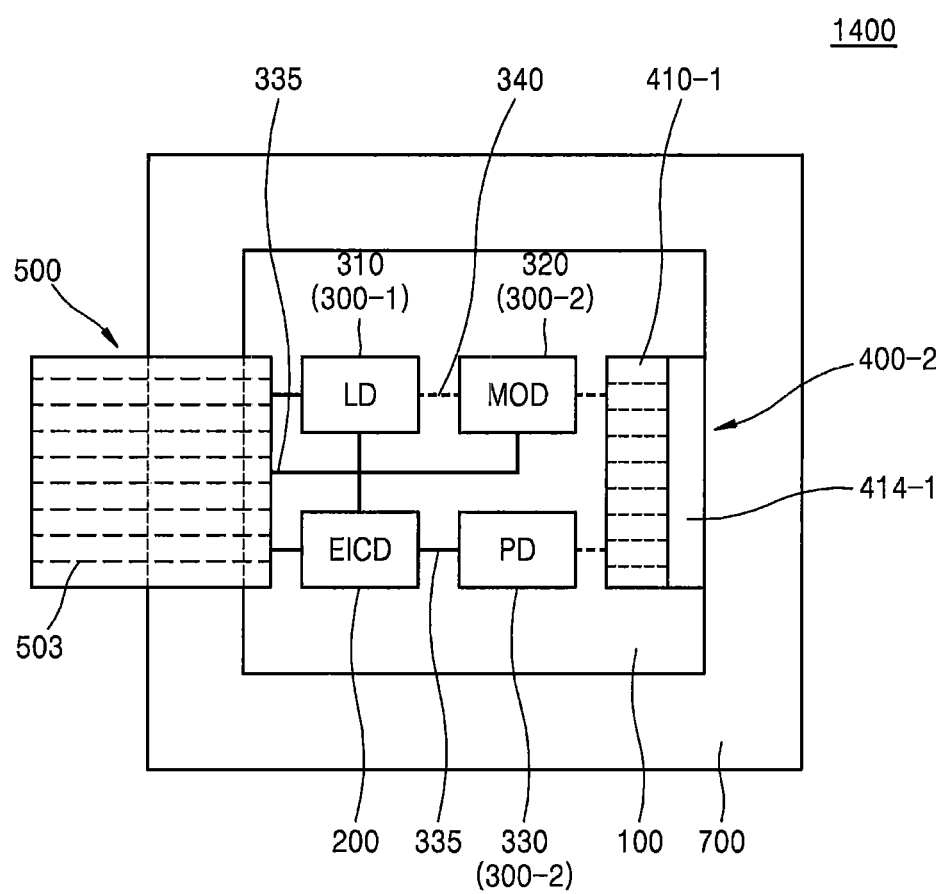
FIG. 14 is a plan view of an optical IC package according to embodiments of the inventive concept.

FIG. 14 is a plan view of an optical IC package 1400 according to embodiments of the inventive concept.

Specifically, the optical IC package 1400 may be the same as the optical IC package 1100 of FIG. 9 except for an optical interface 400-2. The optical IC package 1400 may be provided to illustrate electrical and optical connection of the optical devices 300-1 and 300-2 with the EICD 200.

The optical IC package 1400 may be provided to illustrate optical connection using the optical interface 400-2 of FIG. 13. In FIG. 14, the same reference numerals are used to denote the same elements as in FIG. 9, and repeated descriptions will be simplified or omitted.

The optical IC package 1400 may include an optical IC 100, an EICD 200, optical devices 300-1 and 300-2, an electrical interface 500, an optical interface 400-2, and a heat sink 700. The optical device 300-1 and 300-2 may be divided into a first optical device 300-1 and a second optical device 300-2 for brevity.

The first optical device 300-1 may be an electro-optic converter (e.g., an LD device) capable of generating light (or an optical signal). The second optical device 300-2 may include an optical modulator (MOD) 320 and a photoelectric converter (e.g., a PD) capable of processing an optical signal and an electric signal. The photoelectric converter 330 may be a photodiode (PD) device.

An electrical signal transmitted through an interface interconnection line 503 of the electrical interface 500 may be transmitted to the EICD 200, the electro-optic converter 310, and the optical modulator 320 through a circuit interconnection line 335. The electro-optic converter 310 may generate an optical signal and transmit the optical signal to the optical modulator 320.

The optical modulator 320 may modulate the optical signal in response to the electrical signal transmitted through the circuit interconnection line 335, and transmit the modulated optical signal through the optical waveguide 104 to the optical interface 400-2. The modulated optical signal may be externally transmitted through the alignment device 410-1 and the receptacle connector 414-1 of the optical interface 400-2. When necessary, the EICD 200 may control the electro-optic converter 310 through the circuit interconnection line 335.

Meanwhile, an optical signal externally received through the receptacle connector 414-1 and the alignment device 410-1 included in the optical interface 400 may be transmitted through the optical waveguide 340 to the photoelectric converter 330. The photoelectric converter 330 may convert an optical signal into an electrical signal and transmit the electrical signal to the electrical interface 500 through the EICD 200 and the circuit interconnection line 335. The electrical signal may be externally transmitted through the interface interconnection line 503 of the electrical interface 500.

Figure 15:
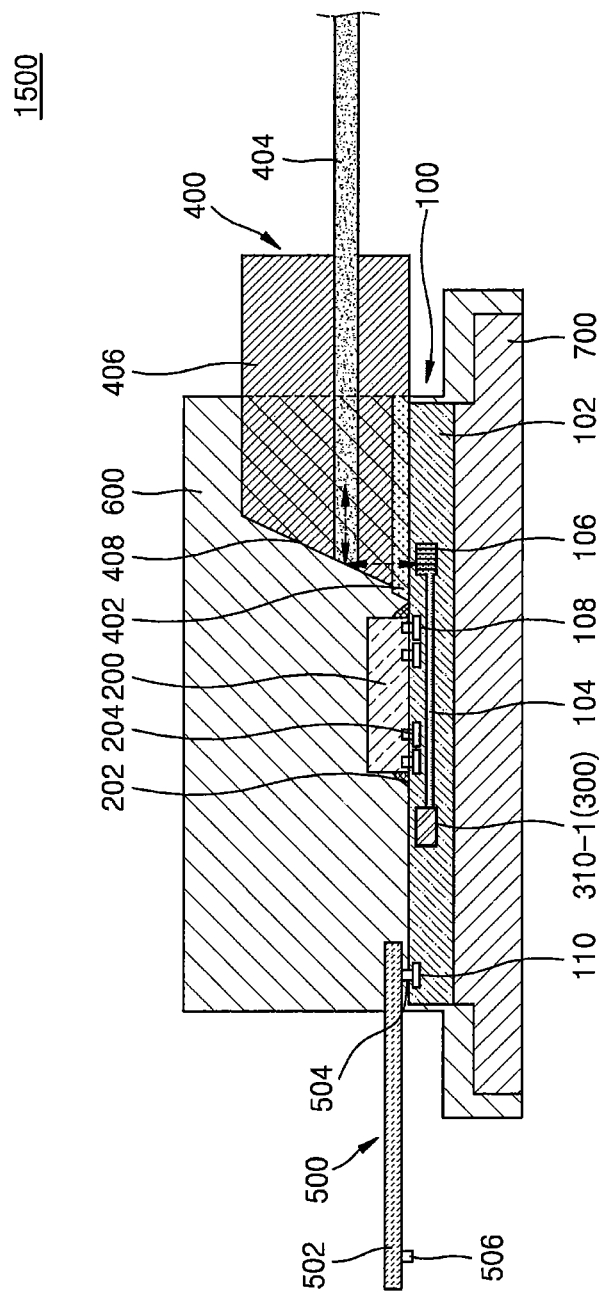
FIG. 15 is a cross-sectional view of an optical IC package according to embodiments of the inventive concept.

FIG. 15 is a cross-sectional view of an optical IC package 1500 according to embodiments of the inventive concept.

Specifically, the optical IC package 1500 may be the same as the optical IC package 1000 of FIG. 1 except for an optical device 310-1 or 300. In FIG. 15, the same reference numerals are used to denote the same elements as in FIG. 1, and repeated descriptions will be simplified or omitted.

The optical IC package 1500 may include an optical IC 100, an EICD 200, the optical device 310-1 or 300, an electrical interface 500, an optical interface 400, and a heat sink 700.

At least one optical device (OD) 300 may be installed in the optical IC substrate 102. The optical device 310-1 or 300 may include an electro-optic converter 310, for example, an LD device. Light (or an optical signal) generated by the electro-optic converter 310-1 may be transmitted to an optical waveguide 104 through an optical coupler 106.

When the optical device 310-1 or 300 is formed in the optical IC substrate 102, optical alignment of the optical waveguide 104 with the optical device 310-1 or 300 may be facilitated, and an optical device forming region or an EICD forming region may be created on the optical IC substrate 102.

Figure 16:
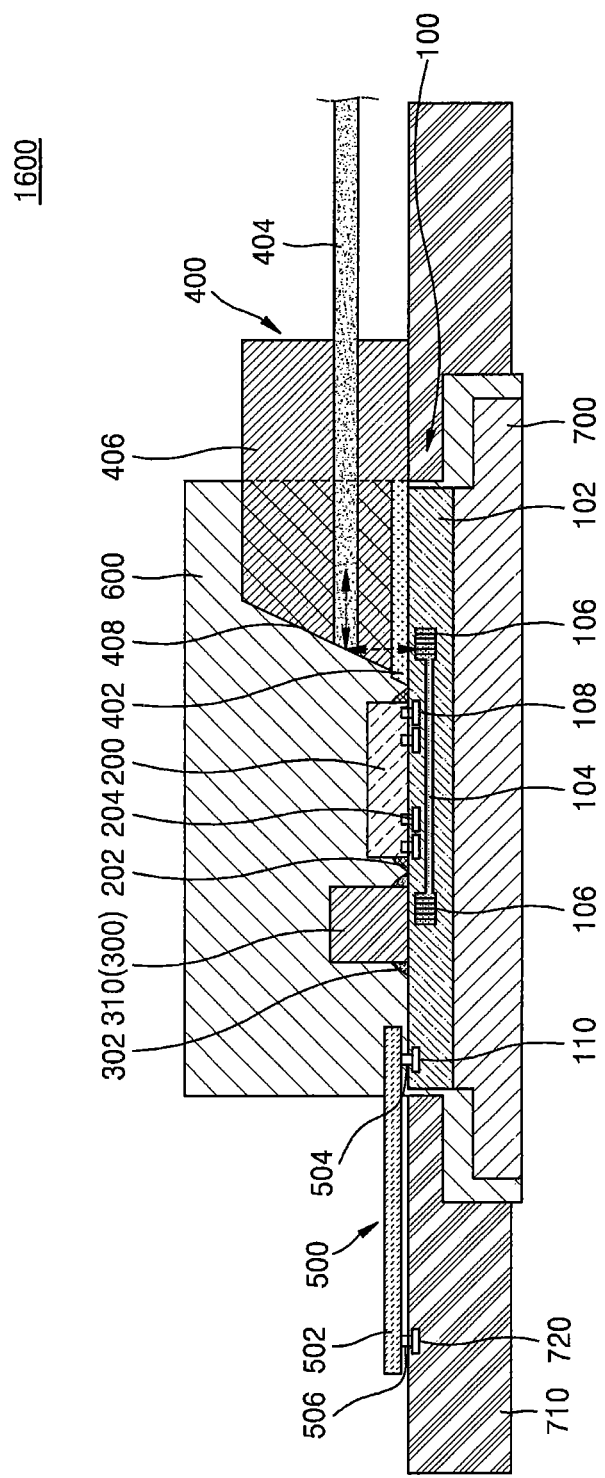
FIG. 16 is a cross-sectional view of an optical IC package according to embodiments of the inventive concept.

FIG. 16 is a cross-sectional view of an optical IC package 1600 according to embodiments of the inventive concept.

Specifically, the optical IC package 1600 may be the same as the optical IC package 1000 of FIG. 1 except that the optical IC package 1600 further includes a base PCB 710. In FIG. 16, the same reference numerals are used to denote the same elements as in FIG. 1, and repeated descriptions will be simplified or omitted.

The optical IC package 1600 may further include a base PCB 710. The base PCB 710 may be a circuit board of an application module (or an application device). The optical IC 100 may be located in the base PCB 710. A second connection pad 506 of an electrical interface 500 may be electrically connected to an interconnection pad 720 of the base PCB 710. An optical interface 400 may be located on the base PCB 700.

Thus, the optical IC package 1600 may be mounted on the base PCB 710, and various optical devices and electrical devices may be mounted on the base PCB 710 to form a module.

Figure 17:
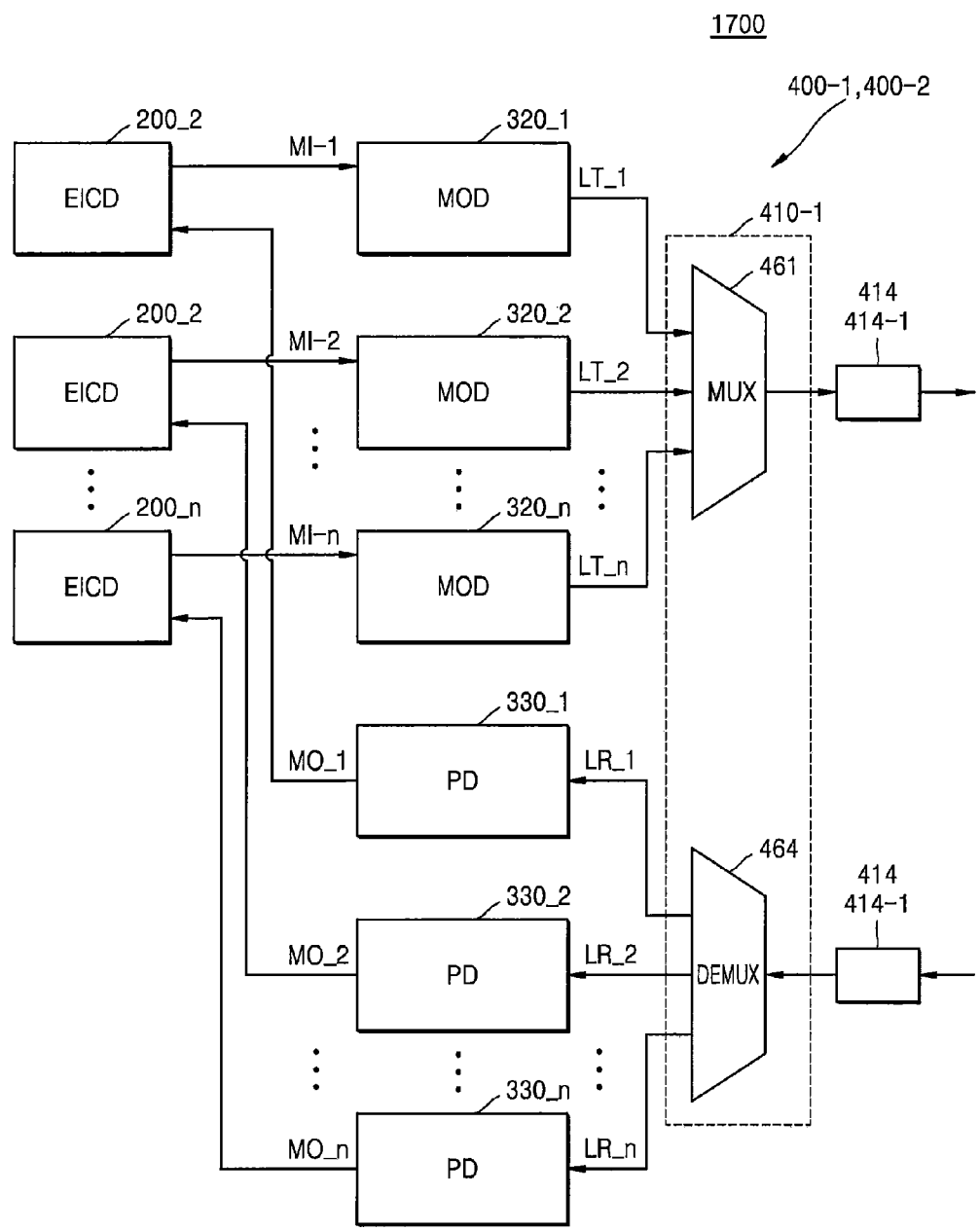
FIG. 17 is a diagram of an optical IC system including an optical IC package according to embodiments of the inventive concept.

FIG. 17 is a diagram of an optical IC system including an optical IC package according to embodiments of the inventive concept.

Specifically, FIG. 17 illustrates an optical IC system 1700 that may include one or more of the optical IC packages 1200, 1300, and 1400 of FIGS. 11 to 14. The optical IC system 1700 may include a plurality of EICDs 200_1 to 200_n, a plurality of optical modulators (MOD) 320_1 to 320_n, a plurality of photoelectric converters (PD) 330_1 to 330_n, an alignment device 410 or 410-1, and receptacle connectors 414 or 414-1.

The alignment device 410 or 410-1 may include an optical signal MUX 461 and an optical signal DEMUX 464. Electro-optic converters are not illustrated in the optical IC system 1700 for brevity.

The plurality of optical modulators 320_1 to 320_n may respectively receive transmission electric signals MI_1 to MI_n from the plurality of EICDs 200_1 to 200_n, modulate the transmission electric signals MI_1 to MI_n, and generate modulated transmission optical signals LT_1 to LT_n. In this case, the modulated transmission optical signals LT_1 to LT_n may be optical signals having respectively different wavelengths.

The optical signal MUX 461 included in the alignment device 410 or 410-1 may multiplex the modulated transmission optical signals LT_1 to LT_n, generate a multiplexed optical signal, and transmit the multiplexed optical signal through the receptacle connectors 414 or 414-1 to an external device or a base PCB.

A multiplexed optical signal transmitted from an external device through the receptacle connectors 414 or 414-1 may be provided to the optical signal DEMUX 464 included in the alignment device 410 or 410-1. The optical signal DEMUX 464 may receive the multiplexed optical signal from the receptacle connectors 414 or 414-1, demultiplex the multiplexed optical signal, and generate modulated reception optical signals LR_1 to LR_n. In this case, the modulated reception optical signals LR_1 to LR_n may be optical signals having different wavelengths.

The plurality of photoelectric converters (PD) 330_1 to 330_n may convert the modulated reception optical signals LR_1 to LR_n into modulated reception electrical signals MO_1 to MO_n, respectively, and provide the modulated reception electrical signals MO_1 to MO_n to the plurality of EICDs 200_1 to 200_n, respectively.

Figure 18:
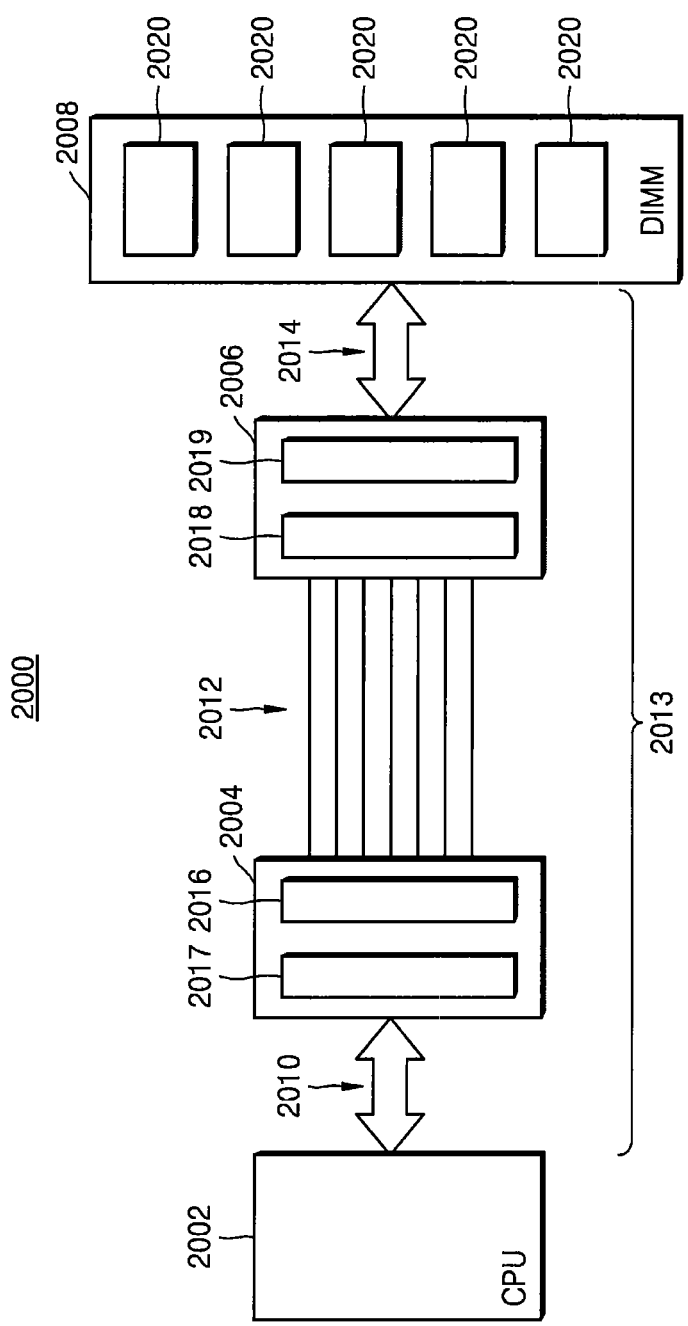
FIG. 18 is a diagram of an optical IC system including an optical IC package according to embodiments of the inventive concept.

FIG. 18 is a diagram of an optical IC system 2000 including an optical IC package according to embodiments of the inventive concept.

Specifically, the optical IC system 2000 may include a central processing unit (CPU) 2002, which may communicate with at least one memory module 2008 via a connection system 2013. The memory module 2008 may be, for example, a dual in-line memory module (DIMM). The DIMM may be a dynamic random access memory (DRAM) module. The memory module 2008 may include a plurality of discrete memory circuits 2020, for example, DRAM memory circuits.

In the present embodiment, the CPU 2002 and the memory module 2008 may generate or process electrical signals. The connection system 2013 may include optical communication channels 2012, for example, optical fibers, which may transmit optical signals between the CPU 2002 and the memory module 2008.

Because the CPU 2002 and the memory module 2008 use electrical signals, an electro-optic conversion operation of converting the electrical signals of the CPU 2002 and the memory module 2008 into optical signals may be performed to transmit signals on the optical communication channels 2012. Also, a photoelectric conversion operation of converting optical signals on the optical communication channels 2012 into electrical signals to be processed by the CPU 2002 and the memory module 2008 may be performed.

The connection system 2013 may include optical IC packages 2004 and 2006 according to embodiments of the inventive concept, which may be located on both sides of the optical communication channels 2012. The optical communication channels 2012 may be optical interfaces of the optical IC packages 2004 and 2006 according to some embodiments.

The CPU 2002 may transmit and receive electrical signals to and from the optical IC package 2004 via an electrical bus 2010. The memory module 2008 may transmit and receive electrical signals to and from the optical IC package 2006 via an electrical bus 2014. The optical IC packages 2004 and 2006 may transmit and receive signals to and from each other. The electrical buses 2010 and 2014 may be electrical interfaces of the optical IC packages 2004 and 2006 according to some embodiments.

The optical IC package 2004 may include a photoelectric converter 2016 and an electro-optic converter 2017. The optical IC package 2006 may include a photoelectric converter 2018 and an electro-optic converter 2019. The electro-optic converters 2017 and 2019 may transmit optical signals to the optical communication channels 2012, for example, optical fibers. The photoelectric converters 2016 and 2018 may receive optical signals from the optical communication channels 2012.

Figure 19:
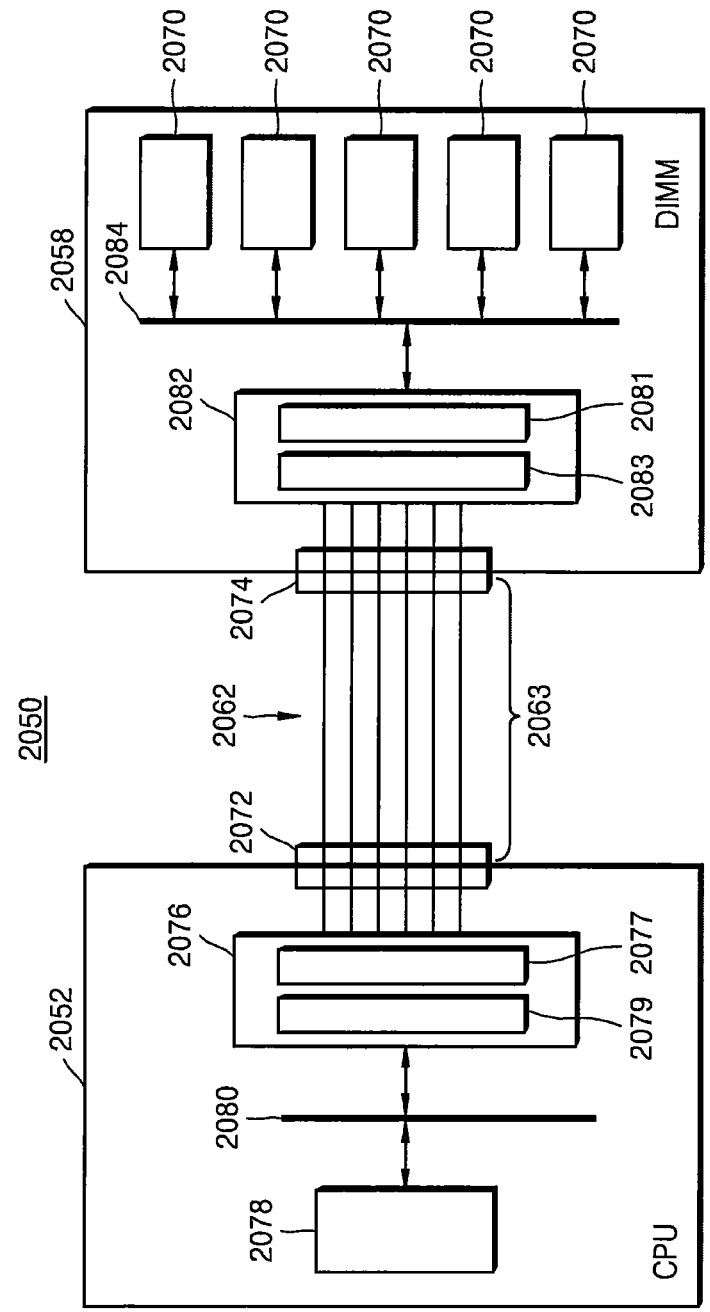
FIG. 19 is a diagram of an optical IC system including optical IC packages according to embodiments of the inventive concept.

FIG. 19 is a diagram of an optical IC system 2050 including optical IC packages 2076 and 2082 according to embodiments of the inventive concept.

Specifically, the optical IC system 2050 may include a CPU 2052 configured to communicate with at least one memory module (e.g., a memory module 2058) through a connection system 2063. The memory module 2058 may be, for example, a dual in-line memory module (DIMM). The memory module 2058 may be, for example, a DRAM module. The memory module 2058 may include a plurality of discrete memory circuits 2070, for example, DRAM memory circuits.

In the present embodiment, the CPU 2052 and the memory module 2058 may generate or process an electric signal and an optical signal. FIG. 19 illustrates an embodiment in which the optical IC packages 2076 and 2082 according to embodiments are embodied in the CPU 2052 and the memory module 2058, respectively.

The CPU 2052 may include the optical IC package 2076, and the memory module 2058 may include the optical IC package 2082. The optical IC package 2076 may include a photoelectric converter 2077 and an electro-optic converter 2079. The optical IC package 2082 may include a photoelectric converter 2083 and an electro-optic converter 2081.

The CPU 2052 may include an electrical circuit 2078 and communicate electrical signals with the optical IC package 2076 via an electrical bus 2080. The memory module 2058 may include the memory circuits 2070 and communicate electric signals with the optical IC package 2082 via an electrical bus 2084. The electrical buses 2080 and 2084 may be electrical interfaces of the optical IC packages 2076 and 2082 according to the embodiments.

The connection system 2063 may include optical communication channels 2062, which may transmit optical signals between the CPU 2052 and the memory module 2058. The optical communication channels 2062 may be, for example, optical fibers. The optical communication channels 2062 may be optical interfaces of the optical IC package according to some embodiments.

The CPU 2052 may include an optical connector 2072. The optical connector 2072 may be a receptacle connector according to some embodiments. An optical signal may be transmitted from the optical IC package 2076 through the optical connector 2072 to the optical communication channels 2062. Also, an optical signal may be transmitted from the optical communication channels 2062 through the optical connector 2072 to the optical IC package 2076.

The memory module 2058 may include an optical connector 2074. An optical signal may be transmitted from the optical IC package 2082 through the optical connector 2074 to the optical communication channels 2062. Also, an optical signal may be transmitted from the optical communication channels 2062 through the optical connector 2074 to the optical IC package 2082.

Figure 20:
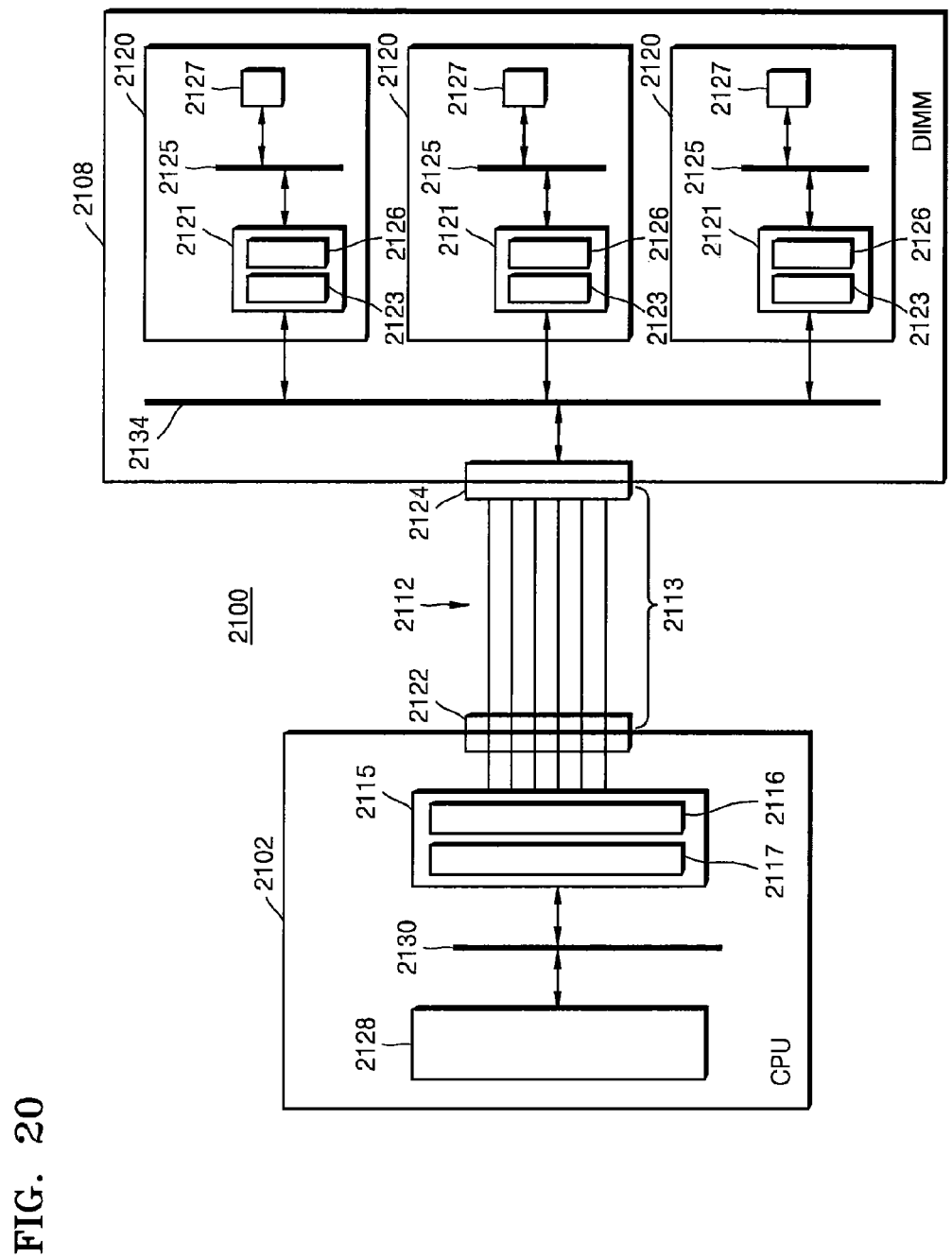
FIG. 20 is a diagram of an optical IC system including an optical IC package according to embodiments of the inventive concept.

FIG. 20 is a diagram of an optical IC system 2100 including an optical IC package according to embodiments of the inventive concept.

Specifically, the optical IC system 2100 may include a CPU 2102, which may communicate with at least one memory module 2108 through an interconnection system 2113. The memory module 2108 may be, for example, a dual in-line memory module (DIMM). The memory module 2108 may be a DRAM module. The memory module 2108 may include a plurality of discrete memory circuits 2120, for example, DRAM memory devices.

In the present embodiment, the CPU 2102 and the memory module 2108 may generate and process an electrical signal and an optical signal. FIG. 20 illustrates embodiments in which optical IC packages 2115 and 2121 according to some embodiments are embodied in the CPU 2102 and memory devices 2120, respectively.

The optical IC package 2115 may include a photoelectric converter 2116 and an electro-optic converter 2117. The optical IC package 2121 may include a photoelectric converter 2123 and an electro-optic converter 2126.

The CPU 2102 may include the optical IC package 2115, and each of the memory circuits 2120 may include an optical IC package 2121. The CPU 2102 may include an electrical circuit 2128 and may transmit and receive electric signals to and from the optical IC package 2115 via an electrical bus 2130.

Each of the memory circuits 2120 may include an electrical circuit 2127 and may transmit and receive electrical signals to and from the optical IC package 2121 via an electrical bus 2125. The electrical buses 2125 and 2130 may be electrical interfaces of the optical IC packages 2115 and 2121 according to some embodiments.

The interconnection system 2113 may include optical communication channels 2112, which may transmit optical signals between the CPU 2102 and the memory module 2108. The optical communication channels 2112 may be, for example, optical fibers. The optical communication channels 2112 may be optical interfaces of an optical IC package according to some embodiments. The CPU 2102 may include an optical connector 2122.

An optical signal may be transmitted from the optical IC package 2115 through the optical connector 2122 to optical communication channels 2112. Also, an optical signal may be transmitted from the optical communication channels 2112 through the optical connector 2122 to the optical IC package 2115.

The memory module 2108 may include an optical connector 2124. An optical signal may be transmitted from the optical IC package 2121 through the optical connector 2124 and an optical bus 2134 to the optical communication channels 2112. Also, an optical signal may be transmitted from the optical communication channels 2112 through the optical connector 2124 to the optical IC package 2121.

Figure 21:
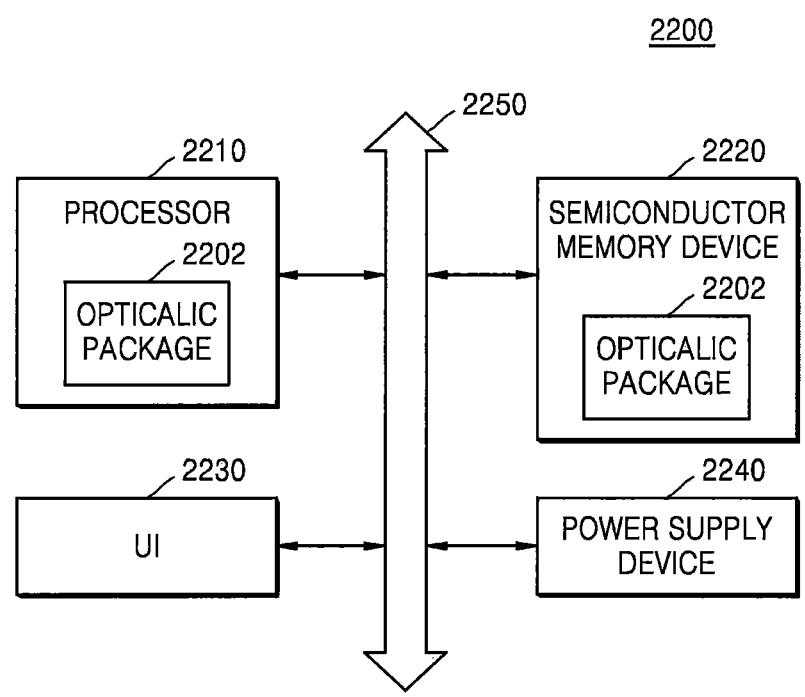
FIG. 21 is a block diagram of a computer system including an optical IC package according to embodiments of the inventive concept.

FIG. 21 is a block diagram of a computer system 2200 including an optical IC package according to some embodiments.

Specifically, the computer system 2200 may include a signal processing system, a display system, a communication system, or another system, which may transmit an optical signal.

The computer system 2200 may include a processor 2210 configured to communicate with another element via an optical bus 2250. The processor 2210 may include an optical IC package 2202 according to some embodiments.

The semiconductor memory device 2220 may be coupled to the optical bus 2250. The semiconductor memory device 2220 may include an optical IC package according to some embodiments. Thus, the semiconductor memory device 2220 may communicate with another element via the optical bus 2250. A power supply device 2240 may communicate with another element via the optical bus 2250. A user interface 2230 may receive inputs from a user and output information in response to the inputs.

While the inventive concept has been particularly shown and described with reference to embodiments thereof, it will be understood that various changes in form and details may be made therein without departing from the spirit and scope of the following claims.

What is claimed is:

1. An apparatus, comprising:
   an optical interface that is configured to carry light signals therethrough;
   an electrical interface that is configured to carry electrical signals therethrough;
   an optical integrated circuit substrate that couples the optical interface to the electrical interface;
   an optical device on the optical integrated circuit substrate;
   a first optical coupler in the optical integrated circuit substrate that is configured to communicate optically with the optical interface using a first light path;
   a second optical coupler in the optical integrated circuit substrate that is configured to communicate optically with the optical device using a second light path; and
   an encapsulation member that encapsulates the optical interface, the electrical interface, the optical integrated circuit substrate, and the optical device;
   wherein the first light path and the second light path each intersect a plane defined by a surface of the optical integrated circuit substrate.

2. The apparatus of claim 1, wherein the optical device comprises an electro-optic converter, a photoelectric converter, or an optical modulator.

3. The apparatus of claim 2, further comprising:
an optical waveguide that is optically connected to the first optical coupler and the second optical coupler in the optical integrated circuit substrate.

4. The apparatus of claim 3, wherein the first and second optical couplers are disposed at opposing ends of the optical waveguide.

5. The apparatus of claim 1, further comprising:
an electrical integrated circuit device (EICD) on the optical integrated circuit substrate;
wherein the encapsulation member encapsulates the EICD.

6. The apparatus of claim 1, further comprising:
a heat sink that contacts the optical integrated circuit substrate;
wherein the encapsulation member contacts multiples sides of the heat sink.

7. The apparatus of claim 1, wherein the encapsulation member is filled with an air layer, a nitrogen layer, or a vacuum layer.

8. The apparatus of claim 1, wherein the first and second optical couplers couples light, which travels in a horizontal direction of the optical integrated circuit substrate, in a vertical direction.

9. The apparatus of claim 1, wherein the optical integrated circuit substrate comprises a silicon semiconductor substrate.

10. The apparatus of claim 1, wherein the optical integrated circuit substrate comprises a Group III-V semiconductor substrate.

11. The apparatus of claim 1, wherein the optical integrated circuit substrate comprises an interconnection pad thereon.

12. The apparatus of claim 11, wherein the electrical interface is electrically connected to the interconnection pad.

13. The apparatus of claim 1, wherein the electrical interface comprises a flexible printed circuit board (FPCB).

14. The apparatus of claim 1, wherein the optical interface is an optical fiber array comprising one of a single optical fiber and a plurality of optical fibers.

15. The apparatus of claim 14, wherein the optical fiber array comprises an inclined section unit configured to modify paths of incident light and emission light.

16. The apparatus of claim 1, wherein the encapsulation member is filled with a transparent material layer.

* * * * *